United States Patent [19]

Wakimoto et al.

[11] Patent Number: 5,185,650
[45] Date of Patent: Feb. 9, 1993

[54] HIGH-SPEED SIGNAL TRANSMISSION LINE PATH STRUCTURE FOR SEMICONDUCTOR INTEGRATED CIRCUIT DEVICES

[75] Inventors: Hirotsugu Wakimoto; Mitsuo Konno, both of Yokohama; Kunio Yoshihara, Kawasaki, all of Japan

[73] Assignee: Kabushiki Kaisha Toshiba, Kawasaki, Japan

[21] Appl. No.: 860,272

[22] Filed: Apr. 1, 1992

Related U.S. Application Data

[63] Continuation of Ser. No. 483,790, Feb. 23, 1990, abandoned.

[30] Foreign Application Priority Data

Feb. 28, 1989 [JP] Japan ................. 1-47251

[51] Int. Cl.$^5$ ............... H01L 27/02; H01L 23/48; H01L 29/46; H01L 25/04
[52] U.S. Cl. .................. 257/508; 257/659; 257/664
[58] Field of Search .......... 357/51, 65, 71, 40, 357/45, 84

[56] References Cited

U.S. PATENT DOCUMENTS

| | | |
|---|---|---|
| 4,654,689 | 3/1987 | Fuji ..................... 357/51 |
| 4,924,290 | 5/1990 | Enkaku et al. ........... 357/71 |

FOREIGN PATENT DOCUMENTS

| | | |
|---|---|---|
| 0154998 | 9/1985 | European Pat. Off. |
| 0259631 | 3/1988 | European Pat. Off. |
| 0307722 | 3/1989 | European Pat. Off. |
| 58-93258 | 6/1983 | Japan ............. 357/65 |
| 63-245953 | 10/1988 | Japan ............. 357/40 |
| 1-162360 | 6/1989 | Japan ............. 357/51 |

OTHER PUBLICATIONS

*Toshiba Technical Bulletin*, vol. 5-9, (Apr. 1987) pp. 123-125.
Patents Abstracts of Japan E-200 Sep. 28, 1983, vol. 7/No. 218—58-111406.

*Primary Examiner*—J. Carroll
*Attorney, Agent, or Firm*—Oblon, Spivak, McClelland, Maier & Neustadt

[57] ABSTRACT

A high-speed semiconductor integrated circuit device has a main circuit section formed on a substrate, and a capacitance section formed on the substrate to surround the main circuit section. The capacitance section is made up of two conductive layers, an upper layer being insulatively disposed above a lower layer. These layers are applied with a power source voltage and a ground voltage, respectively. High-speed signal lines insulatively traverse the capacitance section and are connected to the main circuit section. The capacitance section is disconnected in the region where each signal transmission line passes, and defines a micro-strip type signal transmission line path structure. A "ladder"-shaped connection pattern is provided at each disconnected portion of the capacitance section, for electrically connecting a conductive layer arranged on one side of the disconnected portion to the corresponding layer arranged on the other side of the disconnected portion. The ladder-shaped connection pattern includes first and second parallel connection portions which extend at right angles to their corresponding signal transmission line. The impedance of the signal transmission line can be controlled by altering the horizontal pattern of the connection portions.

16 Claims, 4 Drawing Sheets

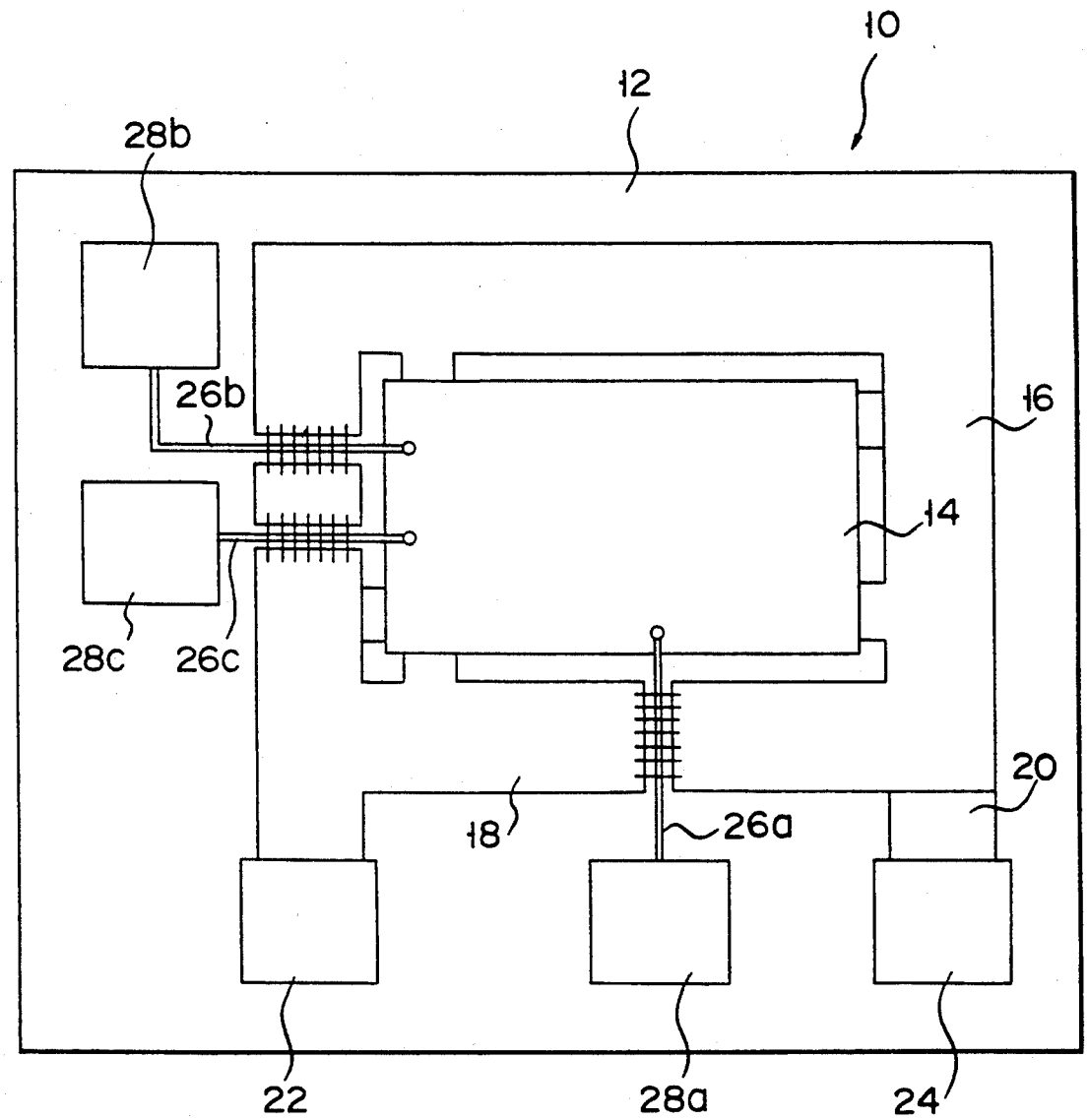
F I G. 1

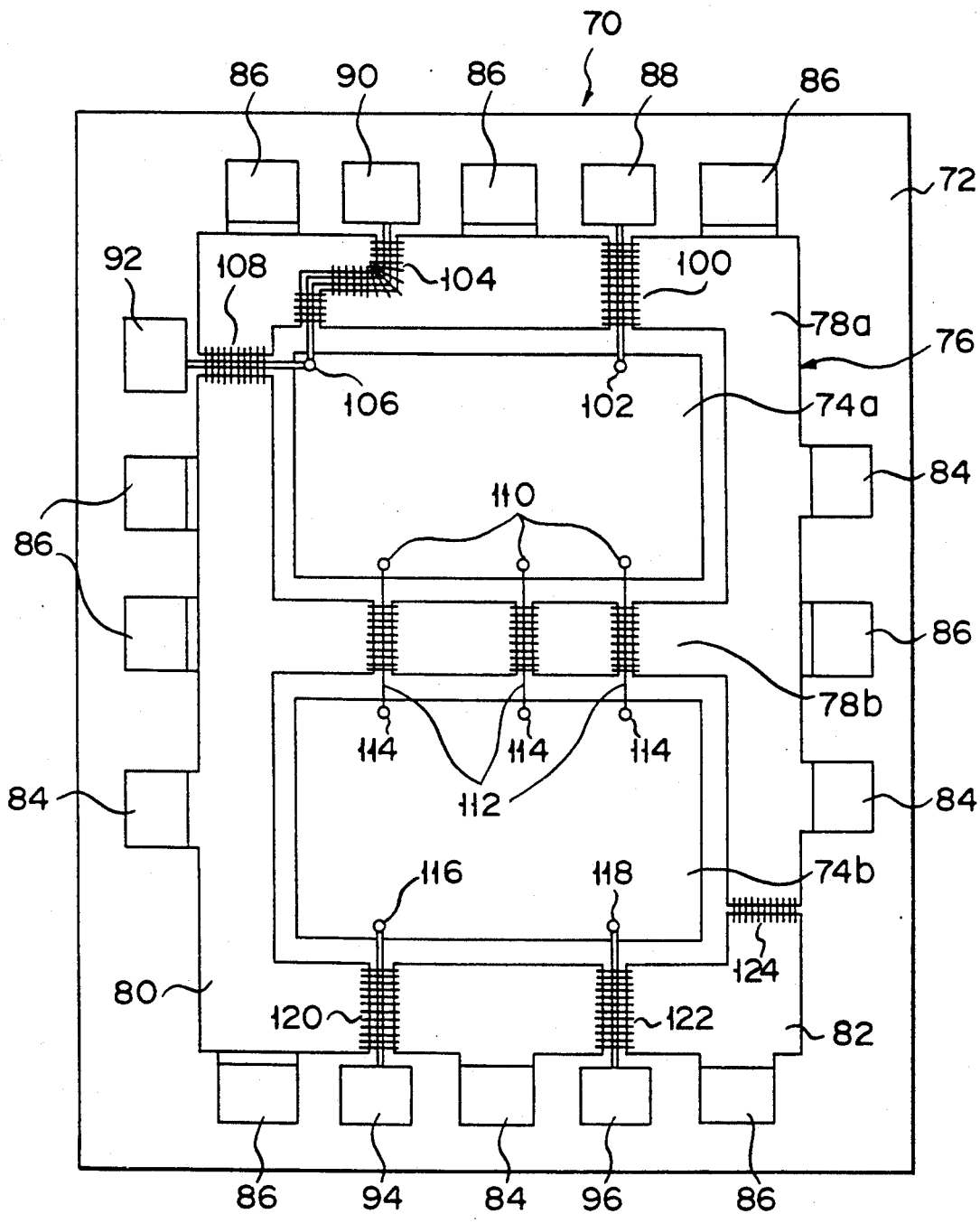
F I G. 10

HIGH-SPEED SIGNAL TRANSMISSION LINE PATH STRUCTURE FOR SEMICONDUCTOR INTEGRATED CIRCUIT DEVICES

This application is a continuation of application Ser. No. 07/483,790, filed on Feb. 23, 1990, now abandoned.

BACKGROUND OF THE INVENTION

1. Field of the Invention

The present invention relates to a high-speed semiconductor integrated circuit device, and more particularly to improvement of an internal wiring structure which is used for semiconductor integrated circuit chips to enable a high-speed operation.

2. Description of the Related Art

With the recent increasing need for high-speed logic performance of digital systems, such as an optical communication apparatus, a supercomputer, etc., the technique for efficiently processing high-speed signals has become indispensable. As basic devices for providing the internal circuits of these electronic devices, an HBT, an HEMT, a GaAs-MESFET, a Si-bipolar transistor, etc. are well known to those skilled in the art. Although the performance of such basic devices has been improved year by year, satisfactorily efficient processing of high-speed signals cannot be expected in the digital systems, if the wiring lines (e.g., a signal transmission line, a power supply line, a grounding line) of the circuit units actually incorporating the basic devices are left unimproved in performance.

In general, an ideal wiring structure used for the circuit units of high-speed digital systems is required to satisfy the following conditions:

(1) satisfactory control of the impedance of the signal lines;

(2) a high signal-to-noise ratio;

(3) remarkable productivity; and (4) maintenance of high reliability during a long-term use.

Condition (1) should be satisfied, so as to prevent signal reflection and/or standing wave generation from occurring in the signal transmission lines of the circuit units. To satisfy condition (2), noise voltage which may be generated inside the circuits should be minimized, for the prevention or suppression of a current variation. To satisfy condition (3), it may be necessary to simplify the wiring pattern structure in both horizontal arrangement and sectional structure, such that the wiring pattern structure can be manufactured without involving much risk by use of the presently-available manufacturing technology. To satisfy condition (4), the wiring pattern structure that satisfies condition (3) should be formed of a material which is chemically or physically stable and which has been already proved to be fully reliable.

However, none of the wiring pattern structures which have been developed for high-speed signal processing up to now simultaneously satisfy all the conditions noted above. This is because the conditions include conflicting requirements, as will be described below.

For example, a wiring pattern structure which satisfies condition (2) is proposed in Toshiba Technical Bulletin Vol. 5-9, Apr. 1, 1987. In the wiring pattern structure of this reference, an insulated lamination structure made up of a power-supply line and a grounding (GND) line is provided around the main circuit section of a semiconductor device in such a manner that a capacitance section is formed between the power-supply line and the GND line. This capacitance section surrounds the main circuit section on the chip substrate; it serves to reduce internal noise arising from a current variation which the main circuit section undergoes in accordance with a level change in a high-speed signal. The capacitance section also serves to suppress external noise.

With this arrangement, a microstrip line path structure is employed, if it is required that high-speed signal lines traversing the capacitance section and extending to the main circuit section be provided without increasing the number of wiring layers. For instance, an upper power supply line of the peripheral capacitance section is partly formed on the lower layer to bypass a peripheral portion of the capacitance section, and high-speed signal lines are formed on the upper layer. On the lower layer of the capacitance section, therefore, the power supply line and the GND line extend in parallel to each other in the regions where the high-speed signal lines are provided. In this case, however, the impedance of the high-speed signal lines cannot be controlled in a satisfactory manner, so that condition (1) mentioned above is difficult to satisfy. In order to permit the high-speed signal lines to have desirable impedance, the material and thickness of a sandwiched insulating layer formed in the capacitance section have to be determined in such a manner as to deviate from the technical conditions presently accepted as common (i.e., a so-called "2 $\mu$m rule"). In addition, the width and thickness of the high-speed signal lines may have to be determined in a similar way. If the insulating layer and the high-speed signal lines are specially designed in this fashion, it is impossible to achieve conditions (3) and (4) mentioned above.

SUMMARY OF THE INVENTION

It is therefore an object of the present invention to provide a new and improved wiring structure for use in high-speed semiconductor devices.

It is another object of the present invention to provide a new and improved wiring structure which is satisfactory in both anti-noise characteristic and impedance control.

In accordance with these objects, the present invention is addressed to a specific impedance-controlled wiring structure for use in a high-speed semiconductor integrated circuit device. In the wiring structure, a high-speed signal transmission line is insulatively disposed above the substrate of the device and has a microstrip wiring structure. First and second capacitance sections are formed on the respective sides of the signal transmission line. Each of the capacitance sections includes first and second conductive layers which are insulatively stacked upon each other. The first conductive layers of the first and second capacitance sections are connected together by a connection pattern section; likewise the second conductive layers of the first and second capacitance sections are connected together by the connection pattern section. The connection pattern section includes first and second connection portions, which are alternately provided on the substrate in parallel to one another, extend under the signal transmission line, and cross the signal transmission line substantially at right angles thereto. The first connection portions connect the first conductive layers together, while the second connection portions connect the second conductive layers together. The microstrip impedance of the signal transmission line can be adjusted to a desirable value by altering the pattern of the first and second connection portions.

The above and further objects and novel features of the present invention will become more apparent from the following detailed description of preferred embodiments.

BRIEF DESCRIPTION OF THE DRAWINGS

In the detailed description of preferred embodiments of the present invention presented below, reference will be made to the accompanying drawings, in which:

FIG. 1 is a diagram schematically illustrating the entire planar arrangement of a high-speed semiconductor integrated circuit device obtained in accordance with a preferred embodiment of the present invention;

FIG. 10 is a diagram schematically illustrating the entire planar arrangement of a high-speed semiconductor integrated circuit device obtained in accordance with still another embodiment of the present invention.

DETAILED DESCRIPTION OF THE PREFERRED EMBODIMENTS

Figure 2:
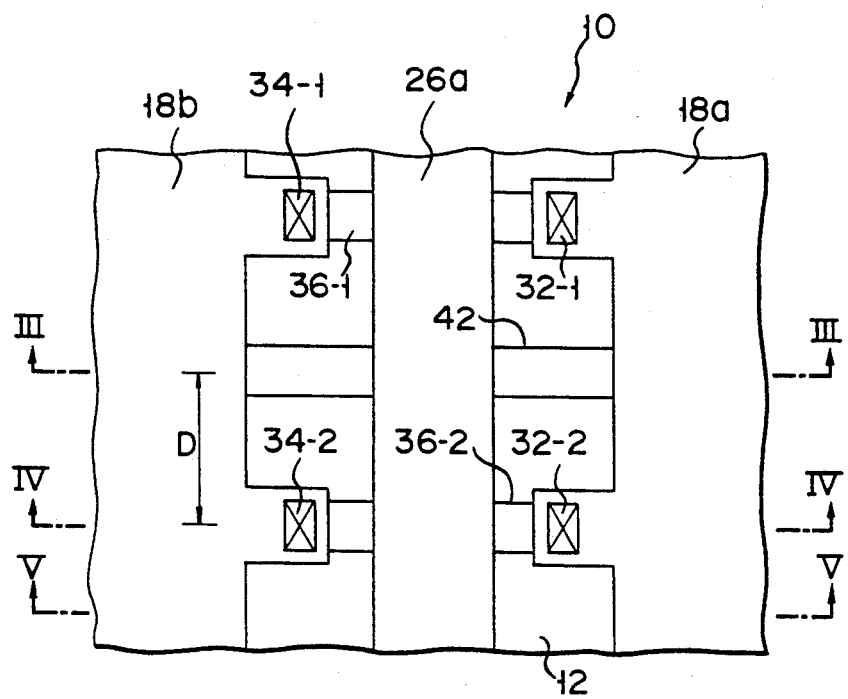
FIG. 2 is a diagram illustrating, in an enlarged scale, the main portion of the device shown in FIG. 1.

In FIG. 1, a high-speed semiconductor integrated circuit device obtained in accordance with the first preferred embodiment of the present invention is generally designated by reference numeral "10". The circuit device has a chip substrate 12 formed of a semi-insulative semiconductor material, such as GaAs. A main circuit section 14 and a capacitance section 16 surrounding the main circuit section are formed on the substrate 12. The capacitance section 16 is of a double-layered structure made up of a power-supply wiring layer 18 and a grounding (GND) wiring layer 20, for example. The power-supply wiring layer 18 has a planar shape which looks like a rectangular closed loop, as is shown in FIG. 1. In this embodiment, the power-supply wiring layer 18 is arranged above the GND wiring layer 20 and is therefore electrically insulated from the GND wiring layer 20. A power-supply pad 22 (i.e., an external connection pad used for the power-supply wiring layer 18) and a grounding (GND) pad 24 (i.e., an external connection pad 24 used for the GN wiring layer 20) are arranged outside the capacitance section 16 and are located in the periphery of the substrate 12.

High-speed signal transmission lines 26a, 26b, and 26c, which are used for transmitting high-speed signals to the main circuit section 14, traverse the capacitance section 16 and are connected to the main circuit section 14 surrounded by the capacitance section 16, in the manner detailed below. As is shown in FIG. 1, external connection pads 28a, 28b, and 28c used for the signal transmission lines 26a, 26b, and 26c are arranged in the periphery of the substrate 12, just like the power-supply pad 22 and the GND pad 24. The signal transmission lines 26 have a microstrip line path structure, and their thickness and width are determined in accordance with the restriction in the presently-available technology (i.e., the "2 $\mu$m rule").

Figure 3:
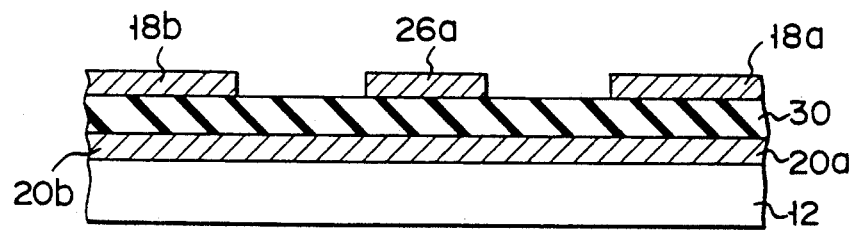
FIGS. 3 through 5 are diagrams illustrating the structures viewed in the sections taken on lines III—III, IV—IV, and V—V shown in FIG. 2, respectively.
Figure 4:
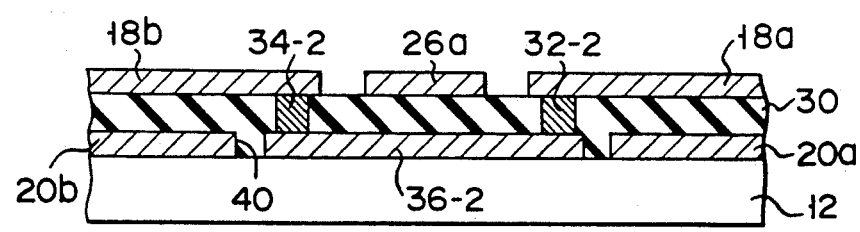
Figure 5:
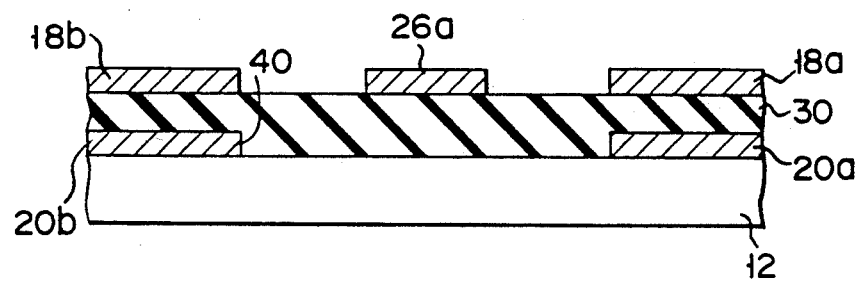

A description will be given in detail with reference to FIGS. 2 through 5 as to how the high-speed signal transmission lines 26 traverse the capacitance section 16. In the description below, high-speed signal transmission line 26a will be taken by way of example. In the capacitance section 16, an insulative layer 30 is formed between the power-supply wiring layer 18 and the GND wiring layer 20, as is shown in FIGS. 3, 4, and 5. The insulative layer 30 functions as an interlayer insulative layer, and its material and thickness are determined in accordance with the restriction in the ordinary manufacturing technology. The insulative layer 30 may be a $SiO_2$ thin film of typically 600 nanometers thick. As is shown in FIG. 2 in an enlarged scale, the power-supply wiring layer 18 of the capacitance section 16 is cut away or disconnected at a region where the signal transmission line 26a passes. A wiring line for connecting the disconnected portions 18a, 18b on the opposite sides of the signal transmission line 26a together is formed in the lower layer of the capacitance section 16, so as to by-pass the signal transmission line 26a.

More specifically, a selected number of interlayer connection sections 32-1, 32-2, . . . (hereinafter referred to as either "contact holes" or "through-hole sections") are formed at equal intervals in the edge portion of the power-supply wiring layer portion 18a located on one side of the signal transmission line 26a. Likewise, the same number of interlayer connection sections 34-1, 34-2, . . . (hereinafter referred to as "contact holes" or "through-hole sections") are formed equal intervals in the edge portion of the power-supply wiring layer portion 18b located on the other side of the signal transmission line 26a. Each of through-holes 32-1, 32-2, . . . is inter-connected to the corresponding one of through holes 34-1, 34-2, . . . through one of bypass connection lines 36-1, 36-2, . . ., as is best illustrated in FIG. 4. The intervals at which the bypass connection lines 36 are formed are equal to those of the through-hole sections 32 and 34. As is shown in FIG. 4, the bypass connection lines 36 are formed in the lower layer of the capacitance section 16, i.e., on the substrate 12. The GND wiring layer 20, which fundamentally constitutes the lower layer of the capacitance section 16, is patterned in such a manner as to avoid the bypass connection lines 36, so that the GND wiring layer 20 and the bypass connection lines 36 do not overlap each other.

The GND wiring layer 20 has rectangular holes 40 which are arranged in a line and located in a region where the signal transmission line 26a of the capacitance section 16 passes, whereby grounding connection lines 42 insulatively crossing the signal transmission line 26a are defined in the holes 40. In the present embodiment, the intervals at which the grounding connection lines 42 of the GND wiring layer 20 are formed are equal to those of the bypass connection lines 36 of the power-supply wiring layer 18. On the substrate 12, each of the bypass connection lines 36 is formed substantially in the center of one of the holes 40 of the GND wiring layer 20; therefore, the bypass connection lines 36 and the grounding connection lines 42 are alternately arranged in the direction in which the signal transmission line 26a extends, as is shown in FIG. 2. If the wiring pattern of the region where the signal transmission line 26a traverses the capacitance section 16 is viewed from above, it will look like a "ladder-shaped" pattern, as is schematically shown in FIG. 1.

With such a ladder-shaped wiring pattern, the bypass connection lines 36 (which function as part of the power-supply wiring layer 18) and the grounding connection lines 42 (which function as part of the GND wiring layer 20) are alternately arranged in a region under the signal transmission line 26a and insulatively extend at right angles to the signal transmission line 26a. The signal transmission line 26a is capacitive-coupled to both the bypass connection lines 36 and the grounding connection lines 42, thereby providing a microstrip line path structure.

In this embodiment, the microstrip line impedance of the signal transmission line 26a can be adjusted to a desirable value by varying the following: the width of each bypass connection line 36 of the power-supply wiring layer 18, the spacing between the adjacent bypass connection lines 36, the width of each grounding connection line 42 of the GND wiring layer 20, and the spacing between the adjacent grounding connection lines 42. These factors can be varied freely and easily by use of patterning technology. It should be noted that the width and thickness of the signal transmission line 26a need not be varied for the impedance control of the signal transmission line 26a of the microstrip line structure. This contributes to efficient impedance control of the signal line 26a. Moreover, both the productivity and reliability of semiconductor devices can be improved since the signal transmission lines 26 can be manufactured without requiring any special patterning condition and since the interlayer insulative layer 30 need not be specially determined for the impedance control. In the case where an $SiO_2$ thin film having a thickness of 300 nm (nanometers) was employed as the interlayer insulative layer 30 of the above embodiment, the microstrip type signal transmission line 26a could have an impedance of 50 $\Omega$ (which is a typical value) by determining the width of the signal transmission line 26a to be 2 $\mu$m (which is a commonly-used value) and by determining the distance D between one bypass connection line 36 and its adjacent grounding connection line 42 to be 6 $\mu$m. The impedance of the high-speed signal line 26a can be adjusted by basically varying the distance D, if a different impedance value is required.

In the embodiment mentioned above, moreover, the signal-to-noise ratio of the main circuit section 14 of the semiconductor device 14 can be improved. The reason for this is that the noise-shielding effect of the capacitance section 16 can be maximized by arranging the bypass connection lines 36 and grounding connection lines 42 at equal intervals in the region located under each signal transmission line 26. In the case where the bypass connection lines 36 and the grounding connection lines 42 are arranged at equal intervals in the above manner, the impedance characteristic of each signal transmission line 26 is made uniform throughout the overall length. If the impedance characteristic of a high-speed signal line 26i is uniform throughout the overall length, the adverse effects which the noise in the power-supply wiring layer 18 may have on the signal transmission line 26i and the adverse effects which the noise in the GND wiring layer 20 may have on the signal transmission line 26i cancel each other. In addition, since the inter-connection can be improved in the region where the signal transmission lines 26 traverse the capacitance section 16, the generation of noise in the power-supply wiring layer 18 can be suppressed.

I should be noted that the main circuit section 14 of the semiconductor device 14 of the above embodiment operates on a negative-polarity type power source. Therefore, the GND wiring layer 20 of the capacitance section 16 is is applied with the highest potential in the device 14. In consideration of this fact, the GND wiring layer 20 is formed directly on the substrate 12 as a lower layer, as is shown in FIGS. 3, 4 and 5. With this arrangement, the operating characteristics of the high-speed FETs incorporated in the main circuit section 14 are reliably prevented from varying due to a so-called "side gate effect."

Figure 6:
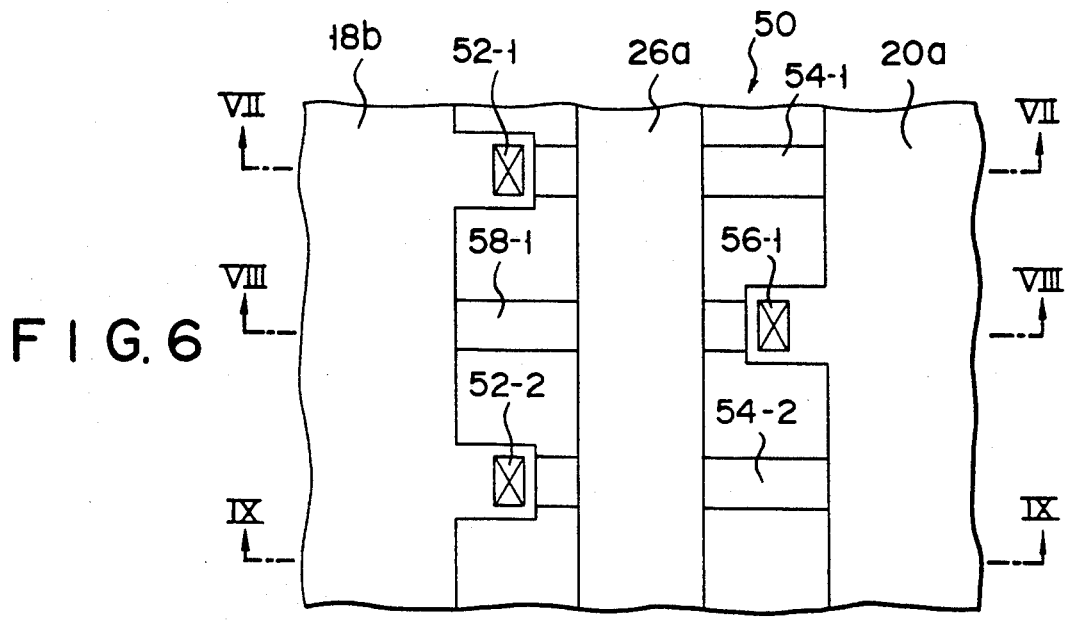
FIG. 6 is a diagram illustrating, in an enlarged scale, the main portion of a high-speed semiconductor integrated circuit device obtained in accordance with another preferred embodiment of the present invention.

FIG. 6 illustrates, in an enlarged scale, the main portion of a high-speed semiconductor integrated circuit device 50 obtained in accordance with the second embodiment of the present invention. In FIG. 6, similar portions to those of FIG. 2 embodiment are denoted by the same reference numerals as used in FIG. 2, and a detailed description of such portions will be omitted herein. The device 50 shown in FIG. 6 differs from the device 10 shown in FIG. 2, in that the vertical arrangement of the power-supply wiring layer 18 and the GND wiring layer 20 on the opposite sides of the signal transmission line 26a is reversed to that mentioned above.

Figure 7:
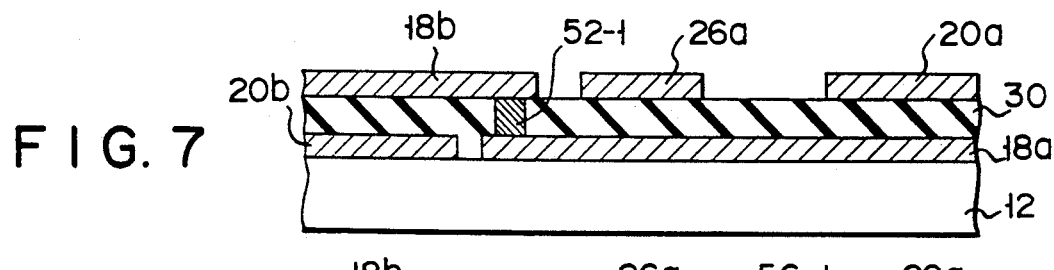
FIGS. 7 through 9 are diagrams illustrating the structures viewed in the sections taken on lines VII—VII, VIII—VIII and IX—IX shown in FIG. 6, respectively.

More specifically, on the left side of the signal transmission line 26a, the power-supply wiring layer 18b is formed above the GND wiring layer 20b as the upper layer of the capacitance section 16, as is shown in FIG. 7. In this point, the device shown in FIG. 6 is similar to that shown in FIG. 2. On the right side of the signal transmission line 26a, however, the power-supply wiring layer 18a is formed on the top surface of the substrate 12 and thus constitutes the lower layer of the capacitance section 16, while the GND wiring layer 20b is formed on the interlayer insulative layer 30 and arranged above layer 18a as the upper layer of the capacitance section 16.

The upper power-supply layer 18b located on the left side of the signal transmission line 26a has contact hole sections (i.e., through-holes) 52-1, 52-2, . . . formed in the insulative layer 30. The lower power-supply layer 18a located on the right side of the high-speed signal line 26a has connection lines 54-1, 54-2, . . . , which look like the teeth of a comb as a whole. As is clear in FIG. 7, through-hole 52-1 is connected to its corresponding connection line 54-1. The other through holes 52-2, . . . are connected to their respective connection lines 54-2, . . . . Due to these through-holes and connection wiring lines, the power-supply wiring layers 18a and 18b located on the respective sides of the high-speed signal line 26a are electrically connected to each other.

Figure 8:
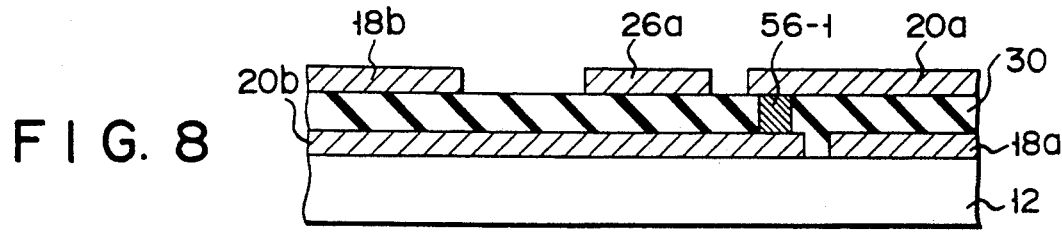
Figure 9:
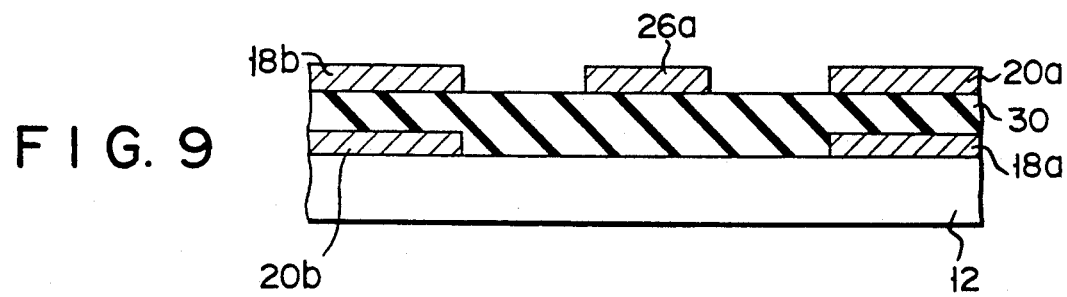

On the other hand, the upper GND wiring layer 20a located on the right side of the signal transmission line 26a has contact hole sections (i.e., through-holes) 56-1, . . . formed in the insulative layer 30. The lower GND wiring layer 20b located on the left side of the signal transmission line 26a has connection wiring lines 58-1, . . ., which look like the teeth of a comb as a whole. As is clear in FIG. 8, through-hole 56-1 is connected to its corresponding connection wiring line 58-1. Although not shown in FIG. 6, the other through-holes 56-2, . . . are connected to their respective corresponding connection lines 58-2, . . . . Due to these through-holes and connection lines, the GND wiring layers 20a and 20b located on the respective sides of the high-speed signal line 26a are electrically connected to each other.

It should be noted that the connection lines 54 and 58 are alternately arranged at equal intervals, as is clearly shown in FIG. 6, thereby providing a ladder-shaped wiring pattern similar to that of the FIG. 2 embodiment. The ladder-shaped wiring pattern of the connection lines 54 and 58 insulatively crosses the corresponding signal transmission line 26a at right angles thereto. Therefore, the device 50 shown in FIG. 6 has similar advantages to those of the device 10 shown in FIG. 2.

FIG. 10 illustrates the main portion of a high-speed semiconductor integrated circuit device 70 obtained in accordance with the third embodiment of the present invention. Referring to FIG. 10, the device 70 has a main circuit portion 74 which is divided, on the chip substrate 72, into first and second function circuit blocks 74a and 74b. The capacitance section 76 of the device 70 is shaped like "8" and surrounds the two circuit blocks 74a and 74b. The capacitance section 76 is made up of a outer frame portion 78a in the form of a rectangular closed loop, and an inner straight portion 78b located between the two circuit blocks 74a and 74b. As in the foregoing embodiments, the capacitance section 76 is of a double-layered structure made up of a power-supply wiring layer 80 and a GND wiring layer 82.

As is shown in FIG. 10, the power-supply wiring layer 80 is connected to external power-supply pads 84, while the GND wiring layer 82 is connected to GND pads 86. The external connection pads indicated by reference numerals 88 and 90 are signal input pad, the external connection pads indicated by reference numeral 92 is a monitoring pad, and the external connection pads indicated by reference numerals 94 and 96 are signal output pads. Signal input pad 88 is connected to a signal terminal 102 of the first function circuit block 74a through a high-speed signal line 100. The signal terminal 102 is provided with a termination resistor having a resistance of e.g. 50 Ω. Signal input pad 90 is connected to another signal terminal 106 of the first function circuit block 74a through a high-speed signal line 104. The signal terminal 106 is connected to the monitoring pad 92 through a high-speed signal line 108. The high-speed signal lines 100, 104 and 108 traverse the capacitance section by use of a ladder-shaped wiring pattern arrangement which is similar to those employed in the foregoing embodiments. Terminal 106 is connected directly to the base electrode of a field effect transistor (FET) of the first function circuit block 74a. A signal which is entered from signal input pad 90 is transmitted to input terminal 106 through high-speed signal line 104, and is then supplied to the gate of the FET. The signal is further transmitted through high-speed signal line 108 to the monitoring pad 92, where it is monitored.

The signal output terminals 110 of the first function circuit block 74a are connected to the signal input terminals 114 of the second function circuit block 74b through high-speed signal lines 112. The high-speed signal lines 112 traverse the inner straight portion 78b of the capacitance section 76 in a similar manner to that mentioned above. Each of the high-speed signal lines 112 is provided with a termination resistor having resistance of e.g. 50 Ω. The signal output terminals 116 and 118 of the second function circuit block 74b are connected to the signal output pads 94 and 96 through high-speed signal lines 120 and 122. The signal lines 120 and 122 traverse the outer frame portion 82 of the capacitance section 76 in a similar manner to that mentioned above by use of the ladder-shaped wiring pattern arrangement. No termination resistor is provided for these high-speed signal lines 120 and 122.

In the capacitance section 76 of the third embodiment, the vertical arrangement of the power-supply wiring layer and the GND wiring layer may be similar to that employed in the first embodiment shown in FIGS. 1 through 5. Alternatively, the vertical arrangement may be determined in such a manner as is employed in the second embodiment shown in FIGS. 6-9; that is, the order in which the power-supply wiring layer and the GND wiring layer may be opposite between both sides of a high-speed signal line. In the third embodiment shown in FIG. 10, most of the high-speed signal lines (namely, signal lines 100, 104, 108, 112, and 120) employ a ladder-shaped wiring pattern structure similar to that described above with reference to FIGS. 2-5. As for high-speed signal line 122, however, a reversion type ladder-shaped wiring pattern structure similar to that described above with reference to FIGS. 6-9 is employed. Specifically, the upper layer of the capacitance section 76 is constituted by different elements between the right and left sides of high-speed signal line 122. On the left side of signal line 122, the power-supply wiring layer 80 constitutes the upper layer of the capacitance section 76, while on the right side, the GND wiring layer 82 constitutes the upper layer of the capacitance section 76. In the device of the third embodiment, a dummy connection section 124 having a ladder-shaped wiring pattern is employed, so as to reverse the vertical arrangement at one location. No high-speed signal line passes over this dummy connection section 124.

The high-speed signal lines 112 used for connecting the two function circuit blocks 74a and 74b together differ in line width from the high-speed signal lines 100, 104, 108, 120, and 122 associated with pads 88, 90, 92, 94 and 96. In comparison with signal lines 100, 104, 108, 120, and 122, signal lines 112 are longer and have a smaller current-driving capacity; therefore, signal lines 112 need not be widened. In the case of the third embodiment, the width of signal lines 112 was determined to be 4 micrometers, the width of the lines of the corresponding ladder-shaped wiring pattern was determined to be 2 μm, and the distance D (FIG. 2) between the lines of the ladder-shaped wiring patterns was determined to be 2 μm. As a result, the microstrip impedance of each high-speed signal line could be successfully determined to be 50 Ω.

Although the invention has been described with reference to specific embodiments, it shall be understood by those skilled in the art that numerous modifications may be made that are within the spirit and scope of the invention.

In the foregoing embodiments, the capacitance section (16, 76) completely surrounds the main circuit section (14, 74); however, the capacitance section may partly surround the main circuit section or be arranged adjacent to the main circuit section, as is ordinarily performed in the art. Even in this case, a high-speed signal line 26a having the above-mentioned remarkable advantages can be obtained by employing the ladder-shaped wiring pattern arrangement for the high-speed signals of the microstrip structure.

What is claimed is:

1. A wiring structure for impedance control, comprising:
   a substrate;

a signal transmission line insulatively overlying the substrate and extending in a first direction;

first and second capacitance sections arranged on respective sides of the signal transmission line, each of said first and second capacitance sections including first and second conductive layers, one of which is insulatively stacked upon the other; and impedance adjusting means for electrically connecting the first conductive layers of the first and second capacitance sections together, for connecting the second conductive layers of the first and second capacitance sections together, and for setting an impedance of said signal transmission line to a target value;

said impedance adjusting means including a plurality of spaced-apart first parallel connection portions for connecting the first conductive layers together, and a plurality of spaced-apart second parallel connection portions for connecting the second conductive layers together; and the first and second parallel connection portions extending in a second direction transverse to the first direction, being adapted to be applied with voltages which are different in potential rom each other, and being alternately arranged on the substrate at certain intervals therebetween, for causing said signal transmission line to be suppressed in a potential variation along the first direction.

2. The structure according to claim 1, wherein said first and second connection portions are arranged on the substrate at substantially constant intervals.

3. The structure according to claim 2, wherein said first and second conductive layers of the first capacitance section are same in a stacking order as said first and second conductive layers of the second capacitance section.

4. The structure according to claim 2, wherein said first and second conductive layers of the first capacitance section are different in a stacking order from said first and second conductive layers of the second capacitance section.

5. A wiring structure for impedance control, comprising:
a substrate;
a signal transmission line insulatively disposed above the substrate and having a microstrip wiring structure;
first and second capacitance sections provided on respective sides of the signal transmission line, each of said first and second capacitance sections including first and second conductive layers, one of which is insulatively stacked upon the other; and
at least one connection means for connecting the first conductive layers of the first and second capacitance sections together and for connecting the second conductive layers of the first and second capacitance sections together;
each said connection means including first parallel connection portions and second parallel connection portions which are alternately arranged on the substrate and which are located below said signal transmission line and cross the signal transmission line substantially at right angles thereto, each of said first and second parallel connection portions comprising a plurality of connection portions; and
said first connection portions connecting the first conductive layers together, and said second connection portions connecting the second conductive layers together, wherein said first and second conductive layers of the first capacitance section are different in a stacking order from said first and second conductive layers of the second capacitance section.

6. A semiconductor integrated circuit device, comprising:
a substrate;
a main circuit section arranged on the substrate;
a capacitance section arranged adjacent to the main circuit section on said substrate, said capacitance section including a conductive lower layer, and a conductive upper layer insulatively disposed above the lower layer, and the upper and lower layers being respectively applied with first and second voltages which are different in potential;
a signal transmission line insulatively traversing the capacitance section and connected to the main circuit section, said signal transmission line dividing the capacitance section into a first capacitance sub-section and a second capacitance sub-section; and
impedance control means for connecting corresponding layers of the first and second capacitance sub-sections together and for controlling the impedance of the signal transmission line, said impedance control means including,
a plurality of spaced-apart first wiring lines for electrically connecting one of the upper and lower layers of the first capacitance sub-section to a corresponding conductive layer of the second capacitance sub-section, and
a plurality of spaced-apart second wiring lines for electrically connecting the other one of the upper and lower layers of the first capacitance sub-section to the remaining conductive layer of the second capacitance sub-section, and
the first and second wiring lines being arranged alternately and extending substantially at right angles to the signal transmission line.

7. The device according to claim 6, wherein said substrate has a top surface on which the first and second wiring lines are arranged.

8. The device according to claim 7, further comprising:
an insulative layer arranged between the upper and lower layers of each of the first and second capacitance sub-sections, said insulative layer covering the first and second wiring lines.

9. The device according to claim 8, wherein said impedance control means includes a plurality of contact holes which are through-holes arranged in the insulative layer.

10. The device according to claim 9, wherein said capacitance section surrounds the main circuit section on the substrate.

11. The device according to claim 10, wherein said main circuit section is divided into a plurality of subsidiary circuit sections.

12. The device according to claim 11, wherein said first and second voltages are a power source voltage and a ground voltage of the device, respectively.

13. A wiring structure for impedance control, comprising:
a substrate;
a signal transmission line insulatively disposed above the substrate and having a microstrip wiring structure;

first and second capacitance sections provided on respective sides of the signal transmission line, each of said first and second capacitance sections including stacked first and second conductive layers;

connection means for electrically connecting the first conductive layers of the first and second capacitance sections together, and for connecting the second conductive layer of the first and second capacitance sections together;

said connection means including a plurality of first parallel connection portions for coupling together said first conductive layers, and a plurality of second parallel connection portions for coupling together said second connection portions, the first and second connection portions being alternately arranged at substantially constant intervals on the substrate and located below said signal transmission line to cross the signal transmission line substantially at right angles thereto; and said first and second connection portions being applied with first and second voltages which are different in potential from each other and at least one of the first and second voltages is a ground potential.

14. The structure according to claim 13, comprising said first and second conductive layers of the first capacitance section being the same in a stacking order as said first and second conductive layers of the second capacitance section.

15. The structure according to claim 13, comprising said first and second conductive layers of the first capacitance section being different in a stacking order from said first and second conductive layers of the second capacitance section.

16. The structure according to claim 5, wherein said first and second connection portions are arranged on the substrate at substantially constant intervals determined beforehand, and wherein said first conductive layers connected together by the first connection portions and said second conductive layers connected together by the second connection portions are applied with voltages which are different in potential.

* * * * *